United States Patent
Tenbroek (10) Patent No.: US 9,385,652 B2
(45) Date of Patent: Jul. 5, 2016

(54) CROSS-COUPLED OSCILLATOR, INTEGRATED CIRCUIT AND ELECTRONIC DEVICE

(71) Applicant: MediaTek Singapore Pte. Ltd., Singapore (SG)

(72) Inventor: Bernard Mark Tenbroek, West Malling (GB)

(73) Assignee: Mediatek Singapore Pte. Ltd., Solaris (SG)

(*) Notice: Subject to any disclaimer, the term of this patent is extended or adjusted under 35 U.S.C. 154(b) by 0 days.

(21) Appl. No.: 14/920,906

(22) Filed: Oct. 23, 2015

(65) Prior Publication Data

US 2016/0126887 A1    May 5, 2016

Related U.S. Application Data

(60) Provisional application No. 62/072,404, filed on Oct. 29, 2014.

(51) Int. Cl.
*H03B 5/12* (2006.01)

(52) U.S. Cl.
CPC ..................... *H03B 5/1212* (2013.01)

(58) Field of Classification Search
CPC .................................................. H03B 5/1212
USPC ................... 331/57, 111, 137, 143, 150, 153
See application file for complete search history.

(56) References Cited

U.S. PATENT DOCUMENTS

| | | | | |
|---|---|---|---|---|
| 5,594,388 A * | 1/1997 | O'Shaughnessy | ....... | H03K 3/03 331/1 R |
| 6,075,419 A * | 6/2000 | Sun | ......... | H03B 27/00 331/177 R |
| 7,268,635 B2 * | 9/2007 | Meltzer | ................ | H03K 3/0315 331/177 V |
| 2002/0113657 A1 * | 8/2002 | Dufour | .................. | H03K 3/354 331/57 |
| 2004/0070461 A1 | 4/2004 | Fredriksson | | |
| 2010/0176892 A1 | 7/2010 | Thompson | | |
| 2014/0232480 A1 * | 8/2014 | Chen | ......... | H03K 3/03 331/111 |
| 2014/0285274 A1 | 9/2014 | Ummelmann et al. | | |

OTHER PUBLICATIONS

Fernandes, The Effect of Mismatches and Delay on the Quadrature Error of a Cross-Coupled Relaxation Oscillator, IEEE Transactions on Circuits and Systems—I:Regular Papers, vol. 54, No. 12, pp. 2592-2598, Dec. 2007.

(Continued)

*Primary Examiner* — Jeffrey Shin
(74) *Attorney, Agent, or Firm* — Optimus Patents US, LLC (57) ABSTRACT

A cross-coupled oscillator arrangement has a first resistance-capacitance oscillator core including at least two inverting stages; and a second resistance-capacitance oscillator core substantially identical to the first resistance-capacitance oscillator core. The first oscillator core and second oscillator core are cross coupled in anti-phase using coupling capacitors. The first oscillator core and second oscillator core are also connected in series such that the first oscillator core is supplied with a supply between a first potential and a second potential and the second oscillator core is supplied with a supply between the second potential and a third potential.

20 Claims, 5 Drawing Sheets

(56) References Cited

OTHER PUBLICATIONS

Ghosh D et al: "A 10 GHz low phase noise VCO emplying current reuse and capacitive power combining", Custom Integrated Circuits Conference (CICC), 2010 IEEE, IEEE, Piscataway, NJ, USA, Sep. 19, 2010, pp. 1-4, XP031786677, ISBN: 978-1-4244-5758-8 *figure 6*.

Nam-Jin Oh et al: "Current reused Lc VCOs", IEEE Microwave and Wireless Components Letters, IEEE Service Center, New York, NY, US, vol. 15, No. 11, Nov. 30, 2005, pp. 736-738, XP001512638, ISSN: 1531-1309, DOI; 10.1109/LMWC.2005.858993 *figure 3*.

\* cited by examiner

CROSS-COUPLED OSCILLATOR, INTEGRATED CIRCUIT AND ELECTRONIC DEVICE

CROSS REFERENCE TO RELATED APPLICATIONS

This application claims the benefit of U.S. provisional application No. 62/072,404, filed on Oct. 29, 2014 and incorporated herein by reference.

BACKGROUND OF THE INVENTION

1. Field of the Invention

The field of this invention relates to a cross coupled oscillator, an integrated circuit comprising a cross coupled oscillator and an electronic device, for example comprising a charge pump and a high power radio frequency (RF) switch arranged to use a clock signal generated by the cross coupled oscillator.

2. Description of the Prior Art

In the field of radio frequency (RF) switches, such as RF silicon-on-insulator (SOI) switches, generally a negative bias is required in order to disable (turn 'off') the SOI switches under a large RF swing. The generation of a negative bias allows the RF switch designer to avoid the use of DC blocking capacitors. Such a negative bias is commonly generated by utilising a charge pump circuit, which requires an oscillator to generate the charge pump clock signals. An oscillator that is coupled to a charge pump circuit that generates a negative bias would typically exhibit low current consumption, and typically needs to be designed with a minimum possible spur current in order to avoid spurious signals for a wireless application.

Figure 1:
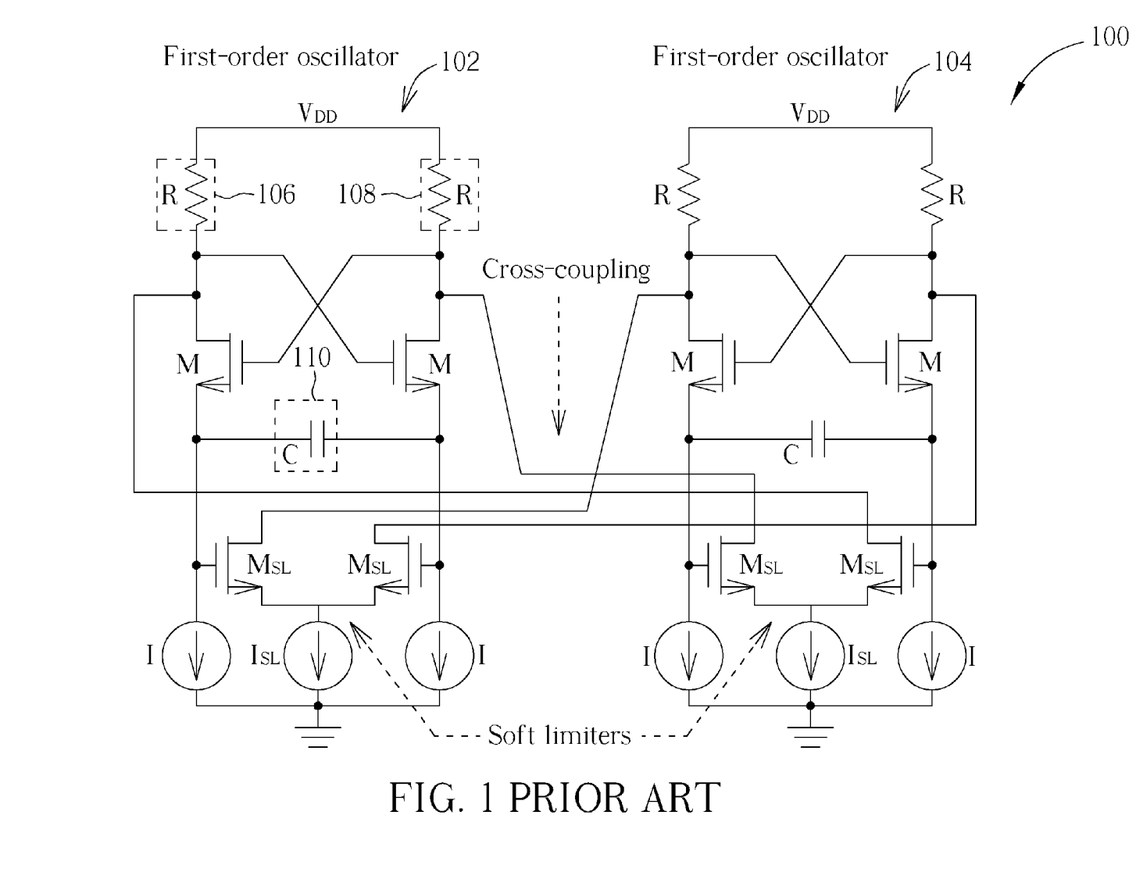
FIG. 1 illustrates a known cross-coupled relaxation oscillator.

Referring to FIG. 1, a known cross-coupled relaxation oscillator 100 is illustrated. Cross-coupling is a well-known oscillation architecture that is used to generate quadrature signals. The cross-coupled relaxation oscillator 100 comprises two cross connected first-order relaxation oscillators 102, 104 arranged in a feedback structure. The first-order relaxation oscillators 102, 104 comprise a basic and well-known resistor-capacitor (RC) 106, 108, 110 oscillator design, but may equally be formed using an integrator and a Schmitt-trigger (memory element) arrangement (not shown). The output of the first first-order relaxation oscillator 102 is 90° out of phase and used to trigger the second first-order oscillator 104.

In this case, the cross-coupling between the first-order relaxation oscillators 102, 104 is provided by a comparator that senses the zero-crossing in the integrator and provides a current signal to the second oscillator core. Hence, the second oscillator core is forced to switch in the middle of the half-period of the first oscillator core. Therefore, the outputs of first-order relaxation oscillator 102, 104 are 90° out of phase with each other, when swinging between $V_{DD}$ and ground. Notably, the first-order relaxation oscillators 102, 104 are arranged in parallel, with each using the $V_{DD}$ supply directly.

This cross-coupled oscillator design suffers from the fact that a significant static current exists, in addition to the current used to charge the capacitors. Additionally, the duty cycle is also dependent upon the NMOS threshold voltage matching between the first-order relaxation oscillators 102, 104, which is often subject to a large process variation.

Thus, there exists a need for an oscillator circuit, for example a cross-coupled oscillator circuit that is capable of producing a clock output for a charge pump in order to generate a negative bias for a high power RF switch and, in particular, an oscillator circuit that may support a lower current consumption and/or better duty cycle control.

SUMMARY

Accordingly, the invention seeks to mitigate, alleviate or eliminate one or more of the above mentioned disadvantages, either singly or in any combination. Aspects of the invention provide a cross-coupled oscillator arrangement, an integrated circuit and an electronic device, for example comprising a charge pump and a high power RF switch, as described in the appended claims.

According to a first aspect of the invention, there is provided a cross-coupled oscillator arrangement comprising a first resistance-capacitance oscillator core comprising at least two inverting stages; and a second resistance-capacitance oscillator core substantially identical to the first resistance-capacitance oscillator core. The first oscillator core and second oscillator core are cross coupled in anti-phase using coupling capacitors. The first oscillator core and second oscillator core are also connected in series such that the first oscillator core is supplied with a supply between a first potential and a second potential and the second oscillator core is supplied with a supply between the second potential and a third potential.

In this manner, a series-connected first oscillator core and second oscillator core, arranged to share the same supply and re-use supply current, may provide a clock signal for a charge pump output that is capable of generating a negative bias. Additionally, such an oscillator arrangement may support a lower current consumption, better spur control and better duty cycle control.

According to an optional feature of the invention, the cross-coupled oscillator arrangement may be operably coupled to an output buffer that is directly driven from both the first oscillator core and the second oscillator core. According to an optional feature of the invention, the output buffer may comprise an NMOS transistor and a PMOS transistor driven by clock signals from the first and second oscillator cores respectively. According to an optional feature of the invention, the PMOS transistor may be driven from the first oscillator core and the NMOS transistor may be driven from the second oscillator core. In this manner, the output buffer drive may be provided by the two distinct, but series-connected, oscillator cores, providing in-phase, but level-shifted clock signals.

According to an optional feature of the invention, the output buffer may be coupled between the first potential and the third potential of the supply.

According to an optional feature of the invention, the output buffer may output a signal that has substantially twice the swing of each of the outputs of the first and second oscillator cores. In this manner, the cross-coupled oscillator inherently provides a level-shifted output, without a need for a separate level shift circuit.

According to an optional feature of the invention, the cross-coupled oscillator has at least one capacitance arranged to minimise perturbations on the second potential and located across at least one of: the first potential and second potential, second potential and third potential. In this manner, perturbations, such as ripple caused due to say, process variations or component tolerances between respective cores, may be removed.

According to a second aspect of the invention, there is provided an integrated circuit comprising a cross-coupled oscillator arrangement according to the first aspect.

According to an optional feature of the invention, the integrated circuit may further comprise a charge pump coupled to the output buffer of the cross-coupled oscillator arrangement and arranged to receive an output clock signal therefrom comprising a combination of clock signals from the first and second oscillator cores. The output clock signal may then be used by the charge pump to generate a negative voltage.

According to a third aspect of the invention, there is provided an electronic device comprising a cross-coupled oscillator arrangement according to the first aspect.

According to an optional feature of the invention, the electronic device may further comprise a charge pump coupled to the output buffer of the cross-coupled oscillator arrangement and arranged to receive an output clock signal therefrom comprising a combination of clock signals from the first and second oscillator cores. The output clock signal may then be used by the charge pump to generate a negative voltage. According to an optional feature of the invention, the electronic device may further comprise a high power radio frequency, RF, switch operably coupled to the charge pump and arranged to receive the generated negative voltage, wherein the output clock signal used by the charge pump to generate the negative voltage is of a form to turn off the high power RF switch.

These and other aspects of the invention will be apparent from, and elucidated with reference to, the embodiments described hereinafter.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale. Like reference numerals have been included in the respective drawings to ease understanding.

DETAILED DESCRIPTION

Examples of the invention will be described in terms of a cross-coupled oscillator circuit that is suitable for use with a charge pump to generate a negative bias for correctly turning off a high power RF switch. In examples of the invention, the cross-coupled oscillator circuit may be arranged to balance the duty cycle of the oscillator output by providing a complementary oscillator that employs two oscillator cores and cross-couples the output nodes of the oscillator cores, unlike the known cross-coupled oscillator architecture of FIG. 1 that uses current feedback between cores to generate quadrature signals. Examples of the invention will also be described in terms of a series-connected cross-coupled oscillator circuit, whereby the oscillator cores of the oscillator circuit share the same supply, but with different potentials, unlike known cross-coupled oscillator circuits that may share the same supply but also share the exact same potentials. In this manner, the oscillator cores of the cross-coupled oscillator circuit may re-use the same supply current. In addition, the oscillator cores of the cross-coupled oscillator circuit may be considered as being series-connected, unlike known cross-coupled oscillator circuits that employ the oscillator cores in a side-by-side (i.e. parallel) arrangement. Examples of the invention will also be described in terms of a series-connected cross-coupled oscillator circuit that provides a separate output buffer that comprises the combined output of both oscillator cores, unlike known cross-coupled oscillator circuits.

Although examples of the invention are described with reference to an electronic device having a series-connected cross-coupled oscillator circuit for providing a clock output to a charge pump for generating a suitably negative bias to turn off the RF high-power switch, it will be appreciated by a skilled artisan that the inventive concepts herein described may be embodied in any type of cross-coupled oscillator circuit or RF switch application. For example, the inventive concepts may find applicability in many high power switch applications, such as used in RF front end components or circuits, high power RF filters, tunable antennas, tunable filters, etc. It is envisaged that the references to 'high power', in this regard, relate to applications where the RF swing on transistor is sufficiently large that a suitable negative voltage is required to turn off the transistor correctly.

The examples herein described also provide a low power clock signal. Hence, it is envisaged that the inventive concept may also be used in any electronic device that may support a low power system that requires an oscillator circuit.

As examples of the invention propose the two oscillator cores being connected in series, for example at a node that has a supply of approximately VDD/2, this supply may encounter perturbations, such as a ripple, due to one or more of many possible factors, such as supply voltage variations, component tolerances between oscillator core components, process variations, etc. One primary effect is that the duty cycle of the oscillator cores before cross coupling is not perfect. It means the oscillator core will draw a different average current during the high cycle as compared to the low cycle and, since the two series-connected cores operate in anti-phase, the instantaneous value of the second potential will be different in each half of the clock period. Thus, some examples of the invention also propose at least one capacitance arranged to minimise ripple on the second potential and located across at least one of: a first potential (e.g. VDD and a second potential, e.g. VDD/2, and/or the second potential and a third potential, e.g. VSS).

Examples of the invention describe an oscillator circuit comprising first and second oscillator cores, where the second oscillator core is substantially identical to the first oscillator core. In this regard, the term 'substantially' encompasses the fact that although the two cores are designed to be identical, they will vary to some degree with regard to component tolerances, process variations, etc.

Figure 2:
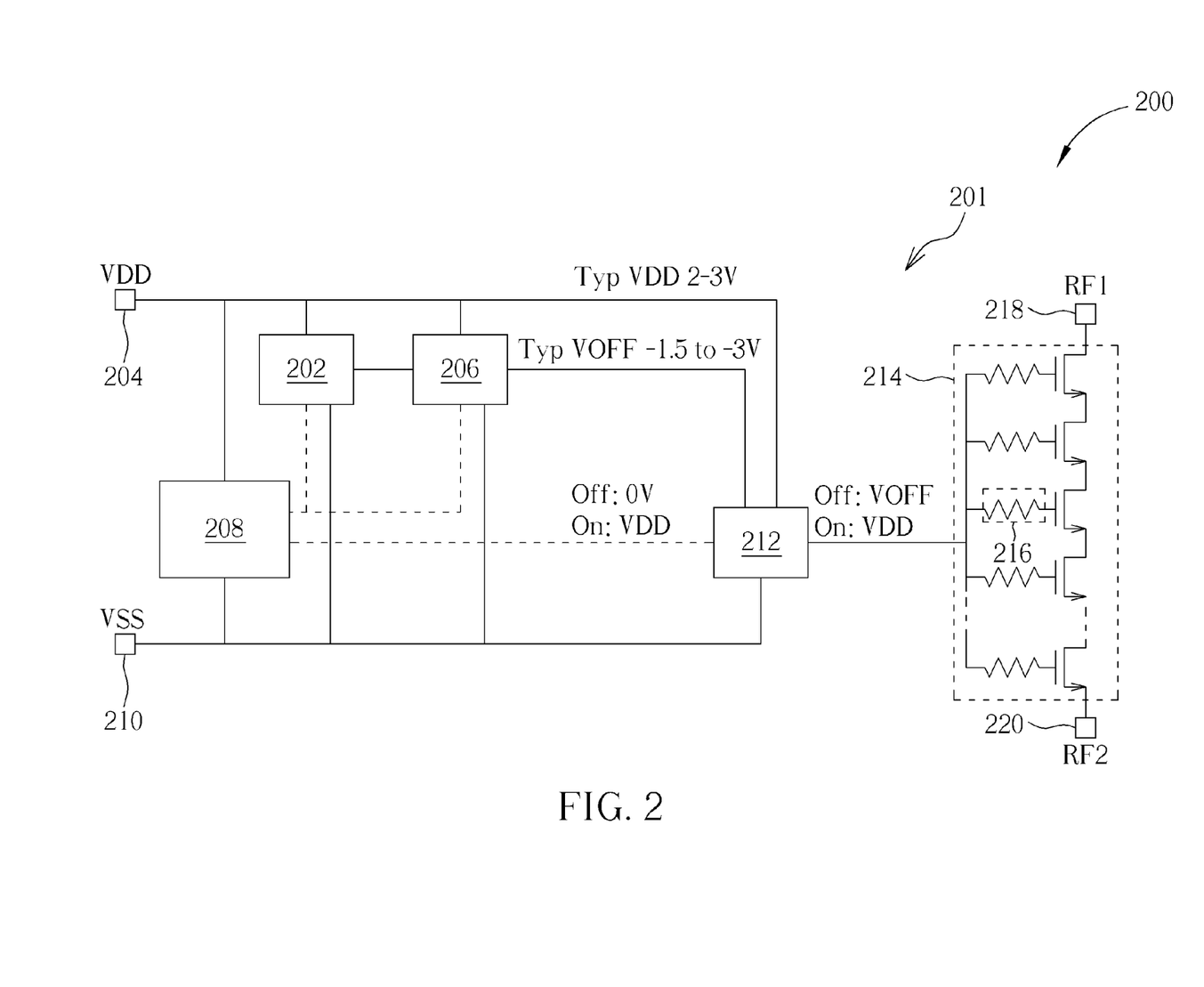
FIG. 2 illustrates an example of an oscillator having a charge pump generating a negative bias and utilised for a switching application, in accordance with some examples of the invention.

Referring to FIG. 2, a detailed example of an electronic device 200. In this example, the electronic device 200 comprises a (high-power) RF switching circuit 201, according to some examples of the invention, is illustrated. In this example, the RF switching circuit 201 comprises an oscillator circuit 202 operably coupled to a supply voltage, VDD, 204 and a VSS, 210. The oscillator circuit 202 provides a clock signal to an off voltage, VOFF, generator circuit 206, which in the examples is implemented as a switched capacitor charge pump. In this example, the oscillator circuit 202 and VOFF generator 206, may be further coupled to a controller 208, which is arranged to control the operation thereof.

In one example, a level shift circuit 212 may be additionally provided, where the level shift circuit 212 is also operably coupled to the controller 208 and receives a voltage signal from VOFF generator circuit 206. The level shift circuit 212 is arranged to shift the voltage level output from the VOFF generator circuit 206 (charge pump) and provide bias voltages to a number of series-connected (from a RF signal generation perspective) high-power RF switches 214, which in some examples may be SOI switches, via respective resistive elements 216. In this manner, the number of series-connected high-power RF switches 214 may be selectively provided with a sufficiently negative bias to correctly turn off the respective high-power RF switch(es) 214 if needed. In some examples, the number of series-connected RF switches 214 may be operably coupled to any number of RF nodes or RF circuits, such as a first RF node 218 (also denoted as RF1) comprising an antenna port and a second RF node 220 (also denoted as RF2), comprising say, a power amplifier, etc.

In some examples, the level shift circuit 212 may receive at least one of: a control signal from the controller 208, which may comprise a logic 'off' signal for example at 0 v, or a logic 'on' signal at VDD 204. In this example, the supply voltage VDD 204, may be in a range of 2-3 volts; and a 'VOFF' signal output from the VOFF generator circuit 206 may comprise a DC voltage in the range of −1.5 to −3 volts. In this manner, when the signal from controller 208 is high, i.e. VDD 204, the output from level shift circuit 212 is also high. However, when the signal from controller 208 is low, i.e. 0 v, the level shift circuit 212 outputs the negative bias signal at −1.5 to −3 volts received from VOFF generator circuit 206.

Figure 3:
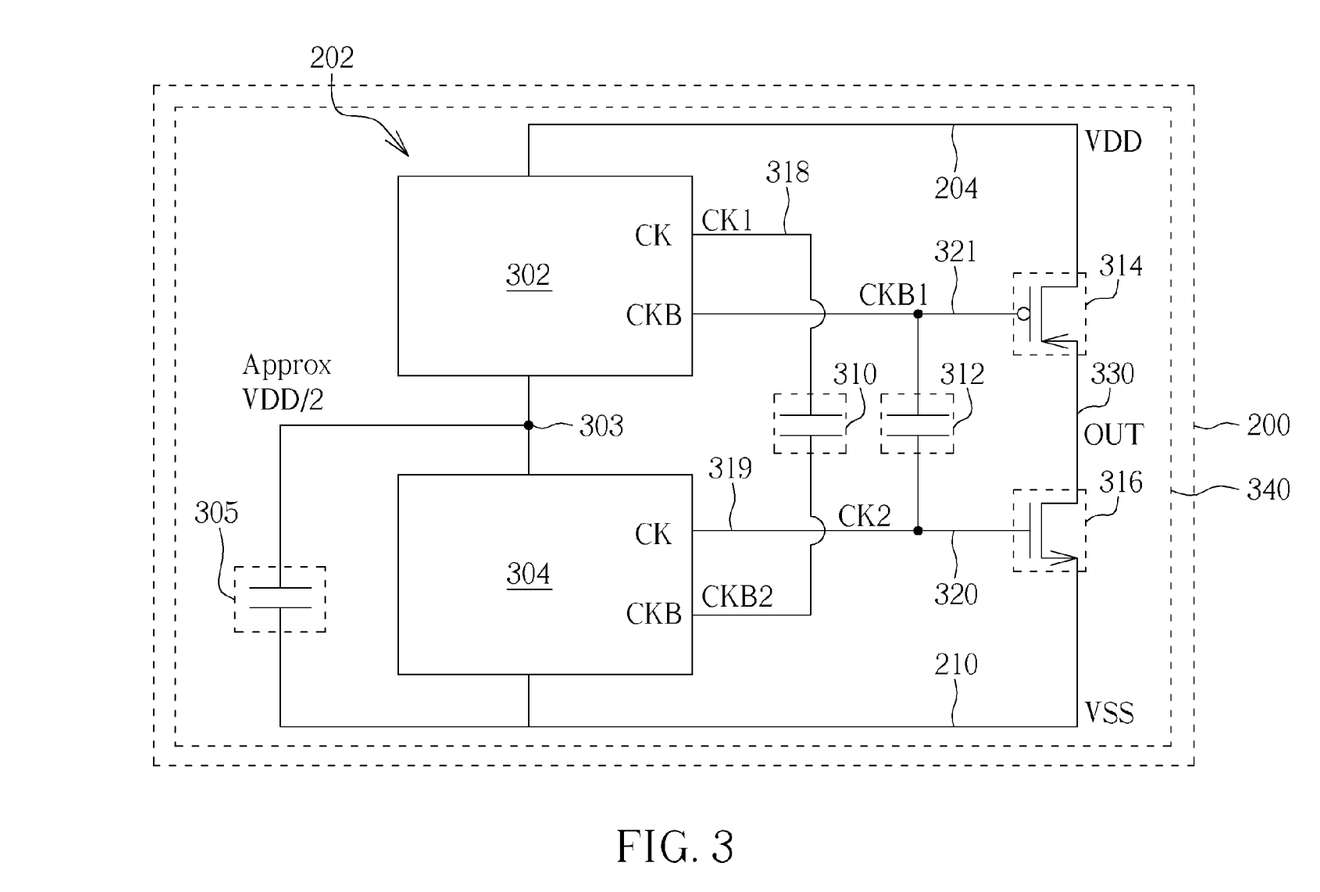
FIG. 3 illustrates a block diagram of an electronic device having an oscillator, in accordance with some examples of the invention.

Referring to FIG. 3, a more detailed example block diagram of an electronic device 200 comprising an oscillator circuit 202 is illustrated. In this example, the oscillator circuit 202 comprises a first oscillator core 302 and a second oscillator core 304. The first oscillator core 302 and the second oscillator core 304 are connected in series in order to share supply voltage, VDD, 204 and a third potential VSS, 210. In accordance with examples of the invention, as shown, the first and second oscillator cores 302, 304 are configured in a series-connected arrangement, and notably each use a second potential of VDD/2 at node 303. The example illustrates the first oscillator core 302 using a supply between VDD, 204 and VDD/2 at node 303. Thus, the second oscillator core 304 uses a supply between second potential of VDD/2 at node 303 and third potential of VSS, 210. In this manner, the first oscillator core 302 and the second oscillator core 304 re-use the supply current.

In this example, the first oscillator core 302 and the second oscillator core 304 form a cross-coupled arrangement, being cross-coupled via coupling capacitors 310, 312 via cross-coupling paths 318, 319. The first oscillator core 302 and the second oscillator core 304 each comprise a clock (CK) output and a clock bar (clock anti-phase) CKB output, such that the clock (CK) output of one oscillator core is operably capacitively cross-coupled to the clock bar (clock anti-phase) CKB output of the other core, in order to average out the systematic duty cycle error of the cores.

The cross-coupling paths 318, 319 are also operably coupled to the gates of NMOS transistor 316 and PMOS transistor 314. In this manner, the respective oscillator core outputs may be combined to produce a balanced duty cycle clock output from the complementary oscillator core arrangement. Thus, in this example, the oscillator circuit 202 may be arranged to enforce, say, a 50% duty cycle of the output of the series-connected cross-coupled oscillator comprising the respective first oscillator core 302 and second oscillator core 304, even when the individual oscillator cores by themselves would have a substantial systematic duty cycle error.

Furthermore, as the oscillator circuit output is divided between the respective oscillator cores, any consequent oscillator spurs will be reduced compared to a single oscillator core output with the full voltage swing of the clock signal. Thus, examples of the invention are particularly beneficial when the generated clock signal is output to sensitive RF circuits.

In this example, an output buffer 330 is provided, in the form of an NMOS/PMOS inverter. As shown, the first oscillator core 302 generates one set of clock signals that switch between VDD/2 and VDD, and the second oscillator core 304 generates a second set of clock signals that switch between VSS and VDD/2. Thus, level shifting is inherently built into the oscillator cross coupling arrangement. Hence, in some examples and due to the complementary nature of the two clock signals output by the respective first oscillator core 302 and second oscillator core 304, a need for a separate level shifting stage, to drive a high swing output buffer with roughly two times the output swing of the oscillator cores themselves, may be avoided. The removal of a separate level shifting stage advantageously reduces current consumption and clock spur current, particularly in battery powered devices.

Advantageously, examples of the invention also facilitate re-use of supply current between oscillator cores, and hence support lower power applications. In one example, the oscillator circuit 202 may be provided within an integrated circuit 340. In some other examples, the integrated circuit 340 may further comprise a charge pump, for example the off voltage, VOFF, generator circuit 206 of FIG. 2. The charge pump may be coupled to the output buffer of the cross-coupled oscillator arrangement and arranged to receive an output clock signal therefrom comprising a combination of clock signals from the first and second oscillator cores. The output clock signal may then be used by the charge pump to generate a negative voltage, for example for use in turning off a high power RF switch, such as one or more of series-connected high-power RF switches 214 of FIG. 2.

Figure 4:
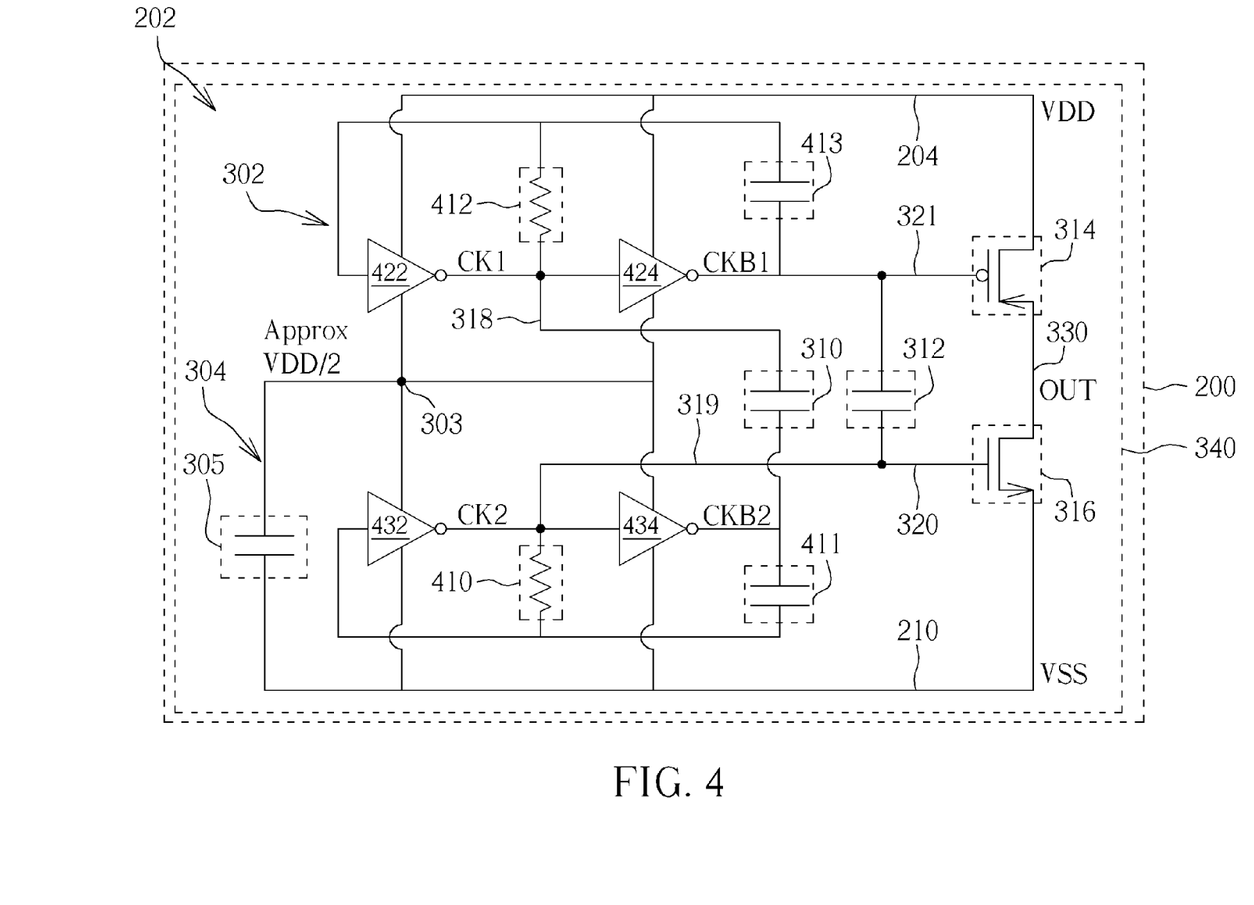
FIG. 4 illustrates a detailed block diagram of the electronic device and oscillator of FIG. 3, in accordance with some examples of the invention.

Referring to FIG. 4, a more detailed example of one optional oscillator circuit 202 of the electronic device 200 is illustrated. The more detailed example of oscillator circuit 202 is a block diagram of an R-C multi-stage oscillator where the active elements are implemented as CMOS inverters, in accordance with some examples of the invention. In this manner, a low cost, minimum-current oscillator design may be supported.

In this example, the oscillator circuit 202 may comprise a first oscillator core 302 that comprises first and second active inverters 422, 424 with an R-C oscillator formed from a single resistor 412 and single capacitor 413. A second oscillator core 304 comprises third and fourth active inverters 432, 434 with an R-C oscillator formed from a further single resistor 410 and further single capacitor 411. The use of a single resistor and single capacitor in each oscillator core minimizes cost and die area due to a use of fewer components.

The current ($I_{DD}$) required to charge and discharge the integrator capacitor is defined as:

$$I_{DD} \sim C \cdot VDD \cdot fosc \quad [1]$$

As such, operating at a low VDD also reduces the current $I_{DD}$. The current required to charge and discharge the oscillator integration capacitor is fundamental to the operation of an RC oscillator. However, current in other parts of the oscillator circuit should be minimized for low power consumption and low RF harmonic spur energy in the supply current. In particular the use of CMOS inverters 422, 424, 432, 434, when used with an appropriate low supply voltage, enable minimum cross-bar current and hence minimum current overhead on top of the fundamental current required to charge and discharge the capacitor.

Hence, one example of the invention that uses an R-C multi-stage oscillator design that employs CMOS inverters, operates the CMOS inverters at a supply voltage a little higher than the sum of the threshold voltages of the NMOS and PMOS device used to form the CMOS inverter. Hence, the best choice of supply voltage VDD, 204, for the series-connected, capacitively cross-coupled, oscillator arrangement is a little higher than, but as close as possible to, 4 Vt (or more precisely 2 NMOS threshold voltages Vts plus 2 PMOS threshold voltages Vts).

A typical R-C multi-stage oscillator provides complementary clock signals. However, non-idealities within, the oscillator core, such as resistor or capacitor process variations, supply voltage variation or threshold voltage variation between the active devices within the oscillator cores, create non-idealities, such as duty cycle error. This problem in known R-C multi-stage oscillator is explained in the publication, titled: 'Microelectronics'; authored by Millman & Grabel, and $2^{nd}$ edition published by McGraw-Hill in 1987.

Furthermore, it is known that such typical R-C multi-stage oscillator designs suffer from systematic duty cycle errors, primarily due to threshold voltages (Vt) of first inverters 422, 432 not being equal to VDD/2. Process control and matching components fail to significantly help this problem. The poor duty cycle is also dependent upon VDD and RC time constant.

The inventor has recognised and appreciated that any error in the duty cycle between the respective oscillator core outputs, when incorporated into the novel, capacitively cross-coupled series-connected oscillator design in FIG. 4, would typically show up as voltage variation on node 303. Hence, in some examples, there may be a benefit in minimising any differences between the respective cores, thereby mitigating the effect of perturbations such as ripples on the VDD/2 supply.

Therefore, in some examples of the invention, a capacitor 305 may be coupled to node 303 (for example between VDD/2 and either or both of VDD 204, VSS 210) to remove or reduce any potential ripple effect.

Thus, the topologies of FIG. 3 and FIG. 4 may provide a better duty cycle control, which may result in a minimum clock high or low period that is larger. For a switched capacitor circuit this may mean that the charge transfer is more efficient, ultimately leading to reduced current consumption too.

Figure 5:
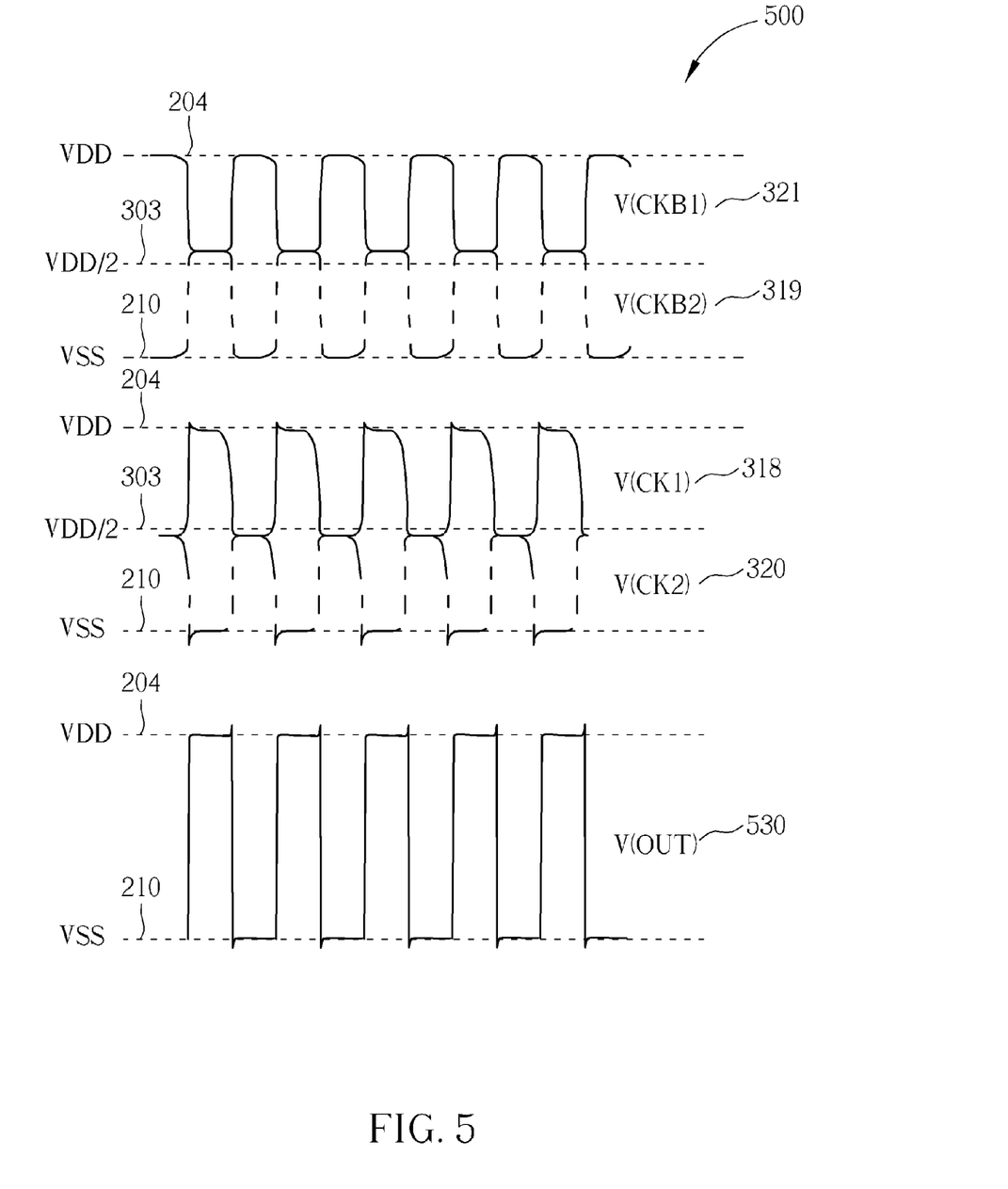
FIG. 5 illustrates example waveforms from the oscillator of FIG. 3 or FIG. 4, in accordance with some examples of the invention.

Referring to FIG. 5, example waveforms 500 from the block diagram of the oscillator circuits of FIG. 3 and FIG. 4 are illustrated. As illustrated, the perturbations, such as ripple, generated on the VDD/2 node 303 result in an uneven distribution of voltages across the respective output clocks from the oscillator cores. That is, the clock signals generated by the respective oscillator cores may not exactly reach VDD/2. However, the complementary nature of the capacitively cross-coupled series-connected oscillator arrangement addresses this potential problem by combining the respective outputs, as shown. In accordance with the example capacitively cross-coupled series-connected oscillator core topologies, a separate output 530 from output buffer 330 is provided. The output 530 being formed by respectively driving the output buffer 330 to output either V(CKB1), namely the CKB output 321 from the first oscillator core 302 driving the PMOS transistor 314, or V(CK2), namely the CK output 320 from the second oscillator core 304 driving the NMOS transistor 316.

A skilled artisan will appreciate that in other applications, alternative functions/circuits/devices and/or other techniques may be used. For example, in other applications, the outputs of the oscillator cores may drive different components or devices, and not necessarily the NMOS/PMOS output buffer arrangement described above. For example, although examples of the invention have been described with reference to a single output clock signal 330 in FIG. 3 and FIG. 4, using for example a combination of CKB1+CK2 to drive buffer 330, it is envisaged that a combination of the clock signals CKB2+CK1 may be generated. In this example, the additional combination of clock signals CKB2+CK1 may be used to drive a second output buffer. In this manner, a complementary clock signal in anti-phase to 'V(OUT)' in FIG. 5 may be additionally provided.

In particular, it is envisaged that the aforementioned inventive concept can be applied by a semiconductor manufacturer to any integrated circuit comprising a capacitively cross-coupled series-connected oscillator core architecture. It is further envisaged that, for example, a manufacturer may employ the inventive concept in a design of a circuit using discrete components or a semiconductor manufacturer may employ the inventive concept in a design of a stand-alone integrated device, such as an application-specific integrated circuit (ASIC). Thus, an integrated circuit manufacturer may provide an integrated circuit that comprises a cross-coupled oscillator arrangement. The cross-coupled oscillator arrangement comprises: a first resistance-capacitance oscillator core comprising at least two inverting stages; and a second resistance-capacitance oscillator core substantially identical to the first resistance-capacitance oscillator core. The first oscillator core and second oscillator core are cross coupled in anti-phase using coupling capacitors; and the first oscillator core and second oscillator core are connected in series such that the first oscillator core is supplied with a supply between a first potential and a second potential and the second oscillator core is supplied with a supply between the second potential and a third potential. In some examples, it is envisaged that the integrated circuit may further comprise a charge pump coupled to the output buffer of the cross-coupled oscillator arrangement and arranged to receive an output clock signal therefrom comprising a combination of clock signals from the first and second oscillator cores. The output clock signal may then be used by the charge pump to generate a negative voltage. The generated negative voltage may then be applied to, say, an RF switch located external to the integrated circuit to turn off the RF switch.

It will be appreciated that, for clarity purposes, the above description has described embodiments of the invention with reference to different functional units and processors. However, it will be apparent that any suitable distribution of functionality between different functional units or circuits, for example with respect to series-connected cross-coupled oscillator cores, may be used without detracting from the invention. Hence, references to specific functional units are only to be seen as references to suitable means for providing the described functionality, rather than indicative of a strict logical or physical structure or organization.

The elements and components of an embodiment of the invention may be physically, functionally and logically implemented in any suitable way. Indeed, the functionality may be implemented in a single unit, in a plurality of units or as part of other functional units.

Although the present invention has been described in connection with some embodiments, it is not intended to be limited to the specific form set forth herein. Rather, the scope of the present invention is limited only by the accompanying claims. Additionally, although a feature may appear to be described in connection with particular embodiments, one skilled in the art would recognize that various features of the described embodiments may be combined in accordance with the invention. In the claims, the term 'comprising' does not exclude the presence of other elements or steps.

Furthermore, although individual features may be included in different claims, these may possibly be advantageously combined, and the inclusion in different claims does not imply that a combination of features is not feasible and/or advantageous. Also, the inclusion of a feature in one category of claims does not imply a limitation to this category, but rather indicates that the feature is equally applicable to other claim categories, as appropriate.

Furthermore, the order of features in the claims does not imply any specific order in which the features must be performed. In addition, singular references do not exclude a plurality. Thus, references to 'a', 'an', 'first', 'second', etc. do not preclude a plurality.

Thus, an improved cross-coupled oscillator circuit, together with an integrated circuit and an electronic device, for example comprising a charge pump coupleable to the improved cross-coupled oscillator circuit and arranged to generate a negative voltage to turn off a high power RF switch, are described. In some examples, the cross-coupled oscillator circuit, integrated circuit and/or electronic device may support a lower current consumption and better duty cycle control in generating a clock signal.

What is claimed is:

1. A cross-coupled oscillator arrangement comprising:
a first resistance-capacitance oscillator core comprising at least two inverting stages; and
a second resistance-capacitance oscillator core substantially identical to the first resistance-capacitance oscillator core;
wherein the first oscillator core and second oscillator core are cross coupled in anti-phase using coupling capacitors; and
wherein the first oscillator core and second oscillator core are connected in series such that the first oscillator core is supplied with a supply between a first potential and a second potential and the second oscillator core is supplied with a supply between the second potential and a third potential.

2. The cross-coupled oscillator of claim 1 wherein the cross-coupled oscillator arrangement is operably coupled to an output buffer that is directly driven from both the first oscillator core and the second oscillator core.

3. The cross-coupled oscillator of claim 2 wherein the output buffer comprises a NMOS transistor and a PMOS transistor driven by clock signals from the first and second oscillator cores.

4. The cross-coupled oscillator of claim 3 wherein the PMOS transistor is driven from the first oscillator core and the NMOS transistor is driven from the second oscillator core.

5. The cross-coupled oscillator of claim 2 wherein the output buffer is coupled between the first potential and the third potential of the supply.

6. The cross-coupled oscillator of claim 2 wherein the output buffer outputs a signal that has substantially twice the swing of each of the outputs of the first and second oscillator cores.

7. The cross-coupled oscillator of claim 2 wherein the output buffer is arranged to be coupled to a charge pump and provide an output clock signal thereto comprising a combination of clock signals from the first and second oscillator cores, and arranged to be of a form to facilitate turn off a high power radio frequency, RF, switch.

8. The cross-coupled oscillator of claim 1 further comprising at least one capacitance arranged to minimise perturbations on the second potential and located across at least one of: the first potential and the second potential, the second potential and the third potential.

9. An integrated circuit comprising a cross-coupled oscillator arrangement comprising:
a first resistance-capacitance oscillator core comprising at least two inverting stages; and
a second resistance-capacitance oscillator core substantially identical to the first resistance-capacitance oscillator core;
wherein the first oscillator core and second oscillator core are cross coupled in anti-phase using coupling capacitors; and
wherein the first oscillator core and second oscillator core are connected in series such that the first oscillator core is supplied with a supply between a first potential and a second potential and the second oscillator core is supplied with a supply between the second potential and a third potential.

10. The integrated circuit of claim 9 wherein the cross-coupled oscillator arrangement is operably coupled to an output buffer that is directly driven from both the first oscillator core and the second oscillator core.

11. The integrated circuit of claim 10 wherein the output buffer comprises a NMOS transistor and a PMOS transistor driven by clock signals from the first and second oscillator cores.

12. The integrated circuit of claim 11 wherein the PMOS transistor is driven from the first oscillator core and the NMOS transistor is driven from the second oscillator core.

13. The integrated circuit of claim 10 wherein the output buffer is coupled between the first potential and the third potential of the supply.

14. The integrated circuit of claim 10 wherein the output buffer outputs a signal that has substantially twice the swing of each of the outputs of the first and second oscillator cores.

15. The integrated circuit of claim 10 further comprising a charge pump coupled to the output buffer and arranged to receive an output clock signal therefrom comprising a combination of clock signals from the first and second oscillator cores, wherein the output clock signal used by the charge pump is used to generate a negative voltage of a form to facilitate turn off of a high power radio frequency, RF, switch.

16. The integrated circuit of claim 9 further comprising at least one capacitance arranged to minimise perturbations on the second potential and located across at least one of: the first potential and the second potential, the second potential and the third potential.

17. An electronic device having a cross-coupled oscillator arrangement comprising:
a first resistance-capacitance oscillator core comprising at least two inverting stages; and
a second resistance-capacitance oscillator core substantially identical to the first resistance-capacitance oscillator core;
wherein the first oscillator core and second oscillator core are cross coupled in anti-phase using coupling capacitors; and wherein the first oscillator core and second oscillator core are connected in series such that the first oscillator core is supplied with a supply between a first potential and a second potential and the second oscillator core is supplied with a supply between the second potential and a third potential.

18. The electronic device of claim 17 wherein the cross-coupled oscillator arrangement is operably coupled to an output buffer that is directly driven from both the first oscillator core and the second oscillator core.

19. The electronic device of claim 18 further comprising a charge pump coupled to the output buffer and arranged to receive an output clock signal therefrom comprising a combination of clock signals from the first and second oscillator cores, wherein the output clock signal used by the charge pump is used to generate a negative voltage.

20. The electronic device of claim 19 further comprising a high power radio frequency, RF, switch operably coupled to the charge pump and arranged to receive the generated negative voltage, wherein the output clock signal used by the charge pump to generate the negative voltage is of a form to turn off the high power RF switch.

\* \* \* \* \*